(12) United States Patent
Fukuda et al.

(10) Patent No.: US 6,266,125 B1
(45) Date of Patent: Jul. 24, 2001

(54) RESIST PROCESSING METHOD AND APPARATUS

(75) Inventors: Yuji Fukuda, Austin, TX (US); Kunie Ogata, Kumamoto (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/317,176

(22) Filed: May 24, 1999

(30) Foreign Application Priority Data

May 25, 1998 (JP) .................................................. 10-143190

(51) Int. Cl.[7] .......................... G03B 27/42; G03B 27/72; G01B 11/02; H01L 21/306
(52) U.S. Cl. ........................... 355/27; 396/570; 396/578; 396/611; 118/712; 134/902; 356/357
(58) Field of Search ................................... 396/570, 578, 396/611, 627; 118/157, 712, 52; 134/902; 355/27; 356/357, 381; 430/30

(56) References Cited

U.S. PATENT DOCUMENTS

| | | | |
|---|---|---|---|
| 4,136,940 | * | 1/1979 | Lin .......................................... 396/570 |
| 4,569,717 | * | 2/1986 | Ohgami et al. ....................... 356/381 |
| 4,647,172 | * | 3/1987 | Batchelder et al. .................. 396/570 |
| 4,851,311 | * | 7/1989 | Millis et al. .......................... 396/570 |
| 5,218,400 | * | 6/1993 | Kashiwagi et al. ..................... 355/57 |
| 5,393,624 | * | 2/1995 | Ushijima ............................... 356/357 |
| 5,848,315 | * | 12/1998 | Kim et al. ............................. 396/567 |
| 5,939,130 | * | 8/1999 | Shiraishi et al. ....................... 118/52 |
| 6,075,606 | * | 6/2000 | Doan .................................... 356/381 |

FOREIGN PATENT DOCUMENTS 2-30194   7/1990   (JP) .

* cited by examiner

*Primary Examiner*—Alan A. Mathews
(74) *Attorney, Agent, or Firm*—Oblon, Spivak, McClelland, Maier & Neustadt, P.C.

(57) ABSTRACT

Before forming a resist pattern, the light reflectivity of the undercoat of the wafer is measured by a reflectivity measuring unit. The conditions are controlled according to the measured reflectivity when forming the resist pattern. The conditions when forming the resist pattern are the rotation speed when supplying the resist solution while rotating the wafer inside the resist coating unit, the exposure time in the exposing unit, the developing time in the developing unit, and so forth. Thus, by controlling the conditions when forming the resist pattern according to the light reflectivity of the wafer's undercoat, a highly fine control of the line width of the resist pattern is made possible.

3 Claims, 12 Drawing Sheets

| REFLECTIVITY (%) | ROTATION SPEED (r.p.m) | DEVELOPING TIME (sec) | EXPOSURE TIME (mj) |
|---|---|---|---|
| 2 0 | 4 9 0 0 | 6 0 | 1 7 |
| 2 5 | 4 7 0 0 | 6 0 | 1 7 |
| 3 0 | 4 5 0 0 | 6 0 | 1 7 |
| 3 5 | 4 3 0 0 | 6 0 | 1 7 |
| 4 0 | 4 1 0 0 | 6 0 | 1 7 |

RESIST PROCESSING METHOD AND APPARATUS

BACKGROUND OF THE INVENTION

1. Field of the Invention

The present invention relates to a resist processing method and a resist processing apparatus for forming a desired resist pattern on the surface of a substrate, such as a semiconductor wafer or an LCD substrate.

2. Description of the Related Art

For instance, in a photolithography process of manufacturing a semiconductor device, the surface of a semiconductor wafer (referred to as a 'wafer' hereinafter) is first coated with a resist. And after exposing the wafer coated with a resist, the wafer is then developed.

Conventionally, as publicly known by the Japanese Patent Publication No. Hei 2-30194, these resist coating and developing processes are performed according to a predetermined sequence before and after an exposing process, within a complex processing system equipped with each corresponding processing units in one system.

However, recently, the resist pattern formed upon the wafer is required to be finer, and a severe control upon the line width of the resist pattern has become inevitable.

Such control concerning the line width of the resist pattern is now carried out, for example, by a worker measuring the actual line width of the resist pattern on the surface of the wafer brought out from the resist coating and developing system, with an SEM (Scanning Electron Microscope), and judging whether the measured value of the line width satisfies the required standards.

SUMMARY OF THE INVENTION

However, the above-mentioned method has some problems. An expensive SEM is needed and considerable labor and time is required for the measurement of the line width. Furthermore, when measuring the line width with an SEM, the wafer must once be brought out and into a vacuum testing room of the SEM, causing contamination of the wafer.

So, for example, by strictly fixing the formation conditions (conditions for coating, exposing and developing the resist) of the resist pattern, the line width of the resist pattern may be controlled more strictly, making such measurement needless. However, the inventors think that there is a limit to controlling the line width of the resist pattern in such a way, no matter how strictly the formation conditions of the resist pattern may be set.

The object of the present invention is to provide a resist processing method and apparatus enabling a highly fine control upon the line width of the resist pattern.

To solve the above-mentioned problems, a first aspect of the invention is a method for forming a predetermined resist pattern on the surface of a substrate coated with an undercoat, comprising the steps of (a) detecting a light reflectivity of the undercoat, (b) coating the substrate with a resist, based upon a first condition, (c) exposing the substrate already coated with the resist, based upon a second condition, (d) developing the exposed substrate, based upon a third condition and (e) controlling at least one of the first, second and third conditions, based upon the detected reflectivity.

A second aspect of the invention is an apparatus for forming a predetermined resist pattern on a substrate already coated with an undercoat, comprising means for detecting a light reflectivity of the undercoat; means for coating the resist on the substrate based upon a first condition; means for exposing the substrate coated with the resist based upon a second condition; means for developing the exposed substrate based upon a third condition; and means for controlling at least one of the first, second and third conditions based upon the detected reflectivity.

When exposing the substrate coated with a resist, light reflects on the undercoat formed under the resist, and this reflected light also helps exposure. Therefore, when the reflectivity of the undercoat differs, the exposure level differs, changing the line width of the resist pattern.

On the other hand, for example, $SiO_2$ and Al having different light reflectivity are formed as the undercoat upon a semiconductor wafer as a substrate. Corresponding to the circuit pattern to be formed, the ratio between the area of $SiO_2$ and the area of Al differs, changing the light reflectivity of the undercoat according to the ratio. When the resist pattern is formed under the same conditions, the line width of the resist pattern changes according to the light reflectivity of the undercoat. The present invention first detects the light reflectivity of the undercoat. And based on the detected reflectivity, the invention controls these conditions, enabling a highly fine control upon the line width of the resist pattern.

A third aspect of the invention is a method for forming a predetermined resist pattern on a substrate already coated with a predetermined undercoat, by coating a resist, exposing and developing, comprising the steps of (a) forming said predetermined undercoat on a substrate for measurement, along with the substrate, (b) coating a resist on the measurement substrate, (c) exposing the measurement substrate, to find out the exposure energy needed and sufficient for the resist to be fully exposed and (d) performing a predetermined process, based upon the exposure energy determined.

These and other objects and profits of the invention can be easily defined by the following explanations and the accompanying drawings.

DETAILED DESCRIPTION OF THE PREFERRED EMBODIMENT

Figure 1:
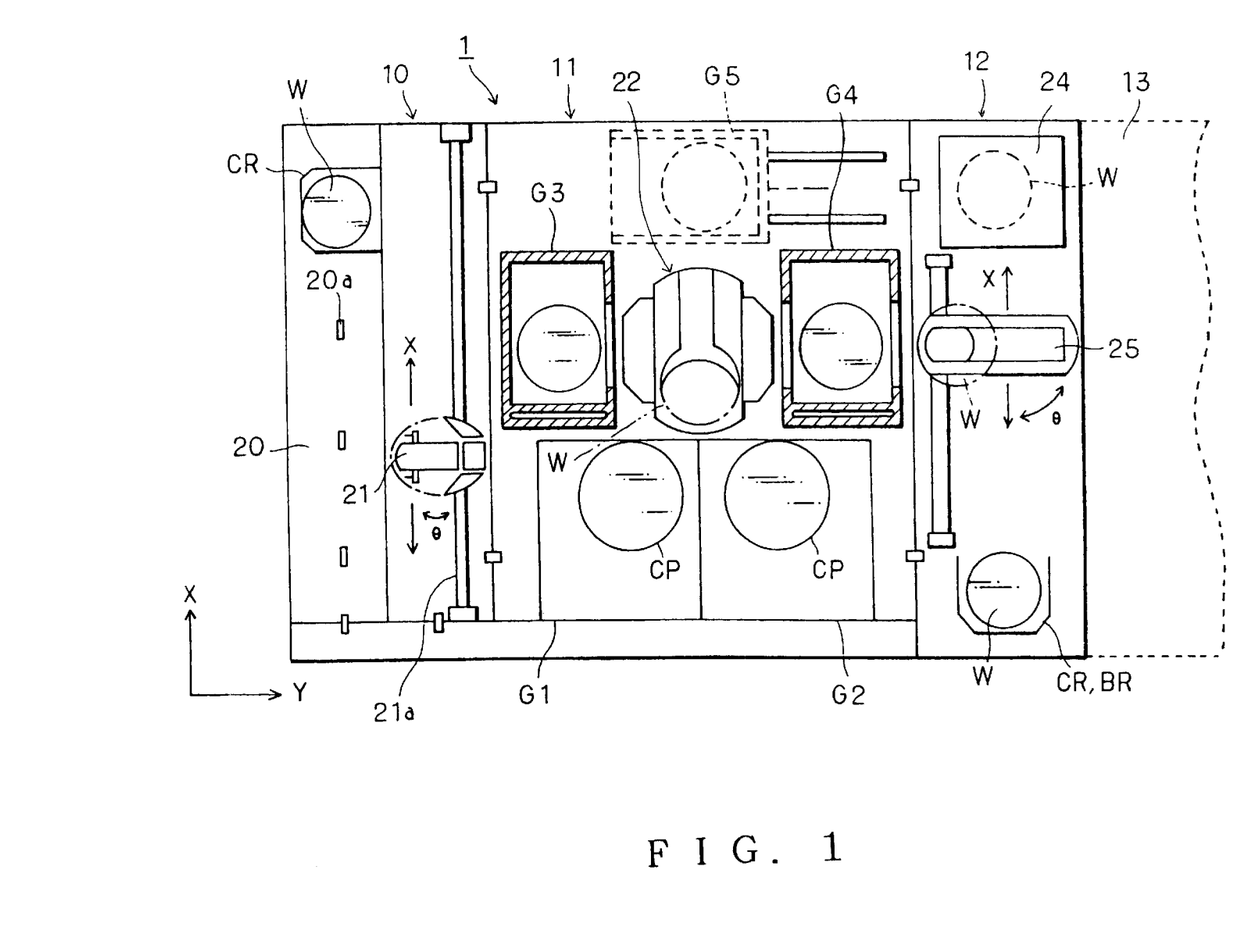
FIG. 1 is a plan view of the resist coating and developing system according to a preferred embodiment of the invention.

As shown in FIG. 1, a resist coating and developing system 1 is a system for coating a chemically amplifying type resist (a highly sensitive photoresist that is exposable to a small amount of ultraviolet rays) on a semiconductor wafer and for developing the wafer. This system 1 is composed of a cassette station 10, a processing station 11, and an interface section 12, connected integrally. In the cassette station 10, wafers W (in units of a cassette C containing a plurality of wafers, for example, twenty five) are transferred into the resist coating and developing system 1 from outside, and then transferred out again. Wafers W are also transferred into and out of the cassette C. In the processing station 11, various kinds of single wafer processing units are multi-tiered at designated positions. Each processing unit performs a predetermined process to the wafer W one by one during the coating and developing steps. In the interface section 12, the wafer W is sent to an exposing unit 13 disposed adjacent to the resist coating and developing system 1.

In the cassette station 10, as shown in FIG. 1, a plurality of cassettes C (four, for example) are arranged in one row in the X direction (the up and down direction shown in FIG. 1), each opening for the wafer W to come in and out facing the processing station 11. The position of the cassettes C is fixed by a positioning projection 20a on a cassette mounting table 20. A wafer transfer unit 21 is movable in the cassettes C arrangement direction (the X direction). It can also move in the wafers W arrangement direction (the Z direction; a vertical direction), that is the direction in which the wafers W stored inside the cassettes C are arranged. This wafer transfer unit 21 moves freely along a transfer path 21a, and makes access selectively to each cassette C.

The wafer transfer unit 21 rotates freely in the θ direction. As will be mentioned afterwards, it also makes access to an alignment unit (ALIM) and an extension unit (EXT), included in the multi-tiered unit section of a third processing unit group G3 on the processing station 11 side.

As shown in FIG. 1, a transfer unit 22 moving vertically is disposed in the center portion of the processing station 11. Around it, one or more sets of various multi-tiered processing units compose processing unit groups, as process chambers. In this resist coating and developing system 1, five processing unit groups G1, G2, G3, G4, and G5 can be disposed. The first processing unit group G1 and the second group G2 are disposed on the front side of the system. The third processing unit group G3 is disposed next to the cassette station 10. The fourth processing unit group G4 is disposed next to the interface section 12. And the fifth processing unit group G5, shown by the dashed line, can be disposed on the back side of the system. The transfer unit 22 rotates freely in the θ direction and moves in the Z direction, so that it can receive/send the wafer W from/to each processing unit.

Figure 2:
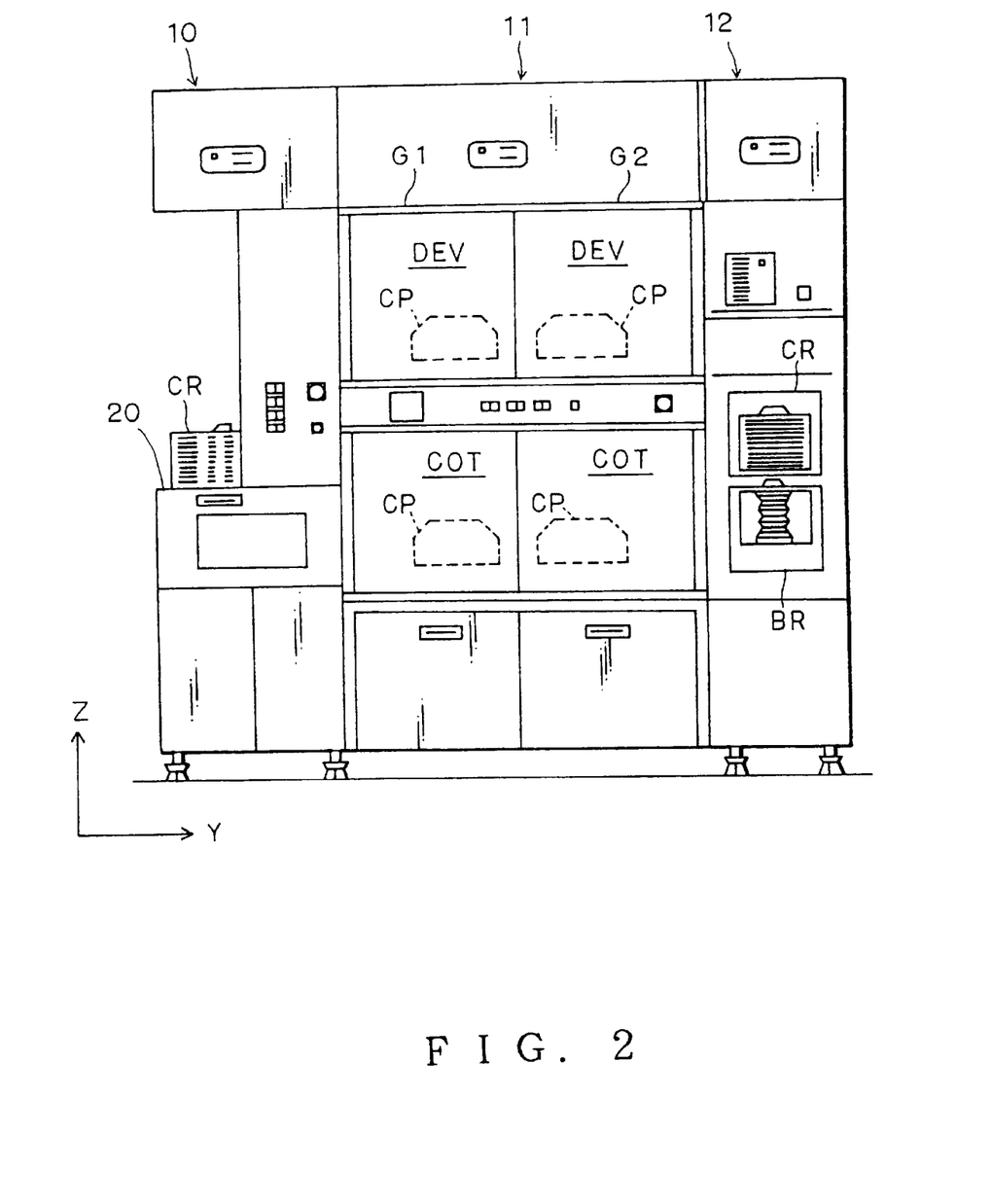
FIG. 2 is a front view of the resist coating and developing system shown in FIG.1.

As shown in FIG. 2, in the first processing unit group G1, two spinner-type processing units, such as a resist coating unit (COT) and a developing unit (DEV), are two-tiered from the bottom in order. These spinner-type processing units mount the wafer W on a spin chuck inside a cup CP to perform a predetermined process. As with the first processing unit group G1, also in the second processing unit group G2, two spinner-type processing units, such as a resist coating unit (COT) and a developing unit (DEV) are two-tiered from the bottom in order.

Figure 3:
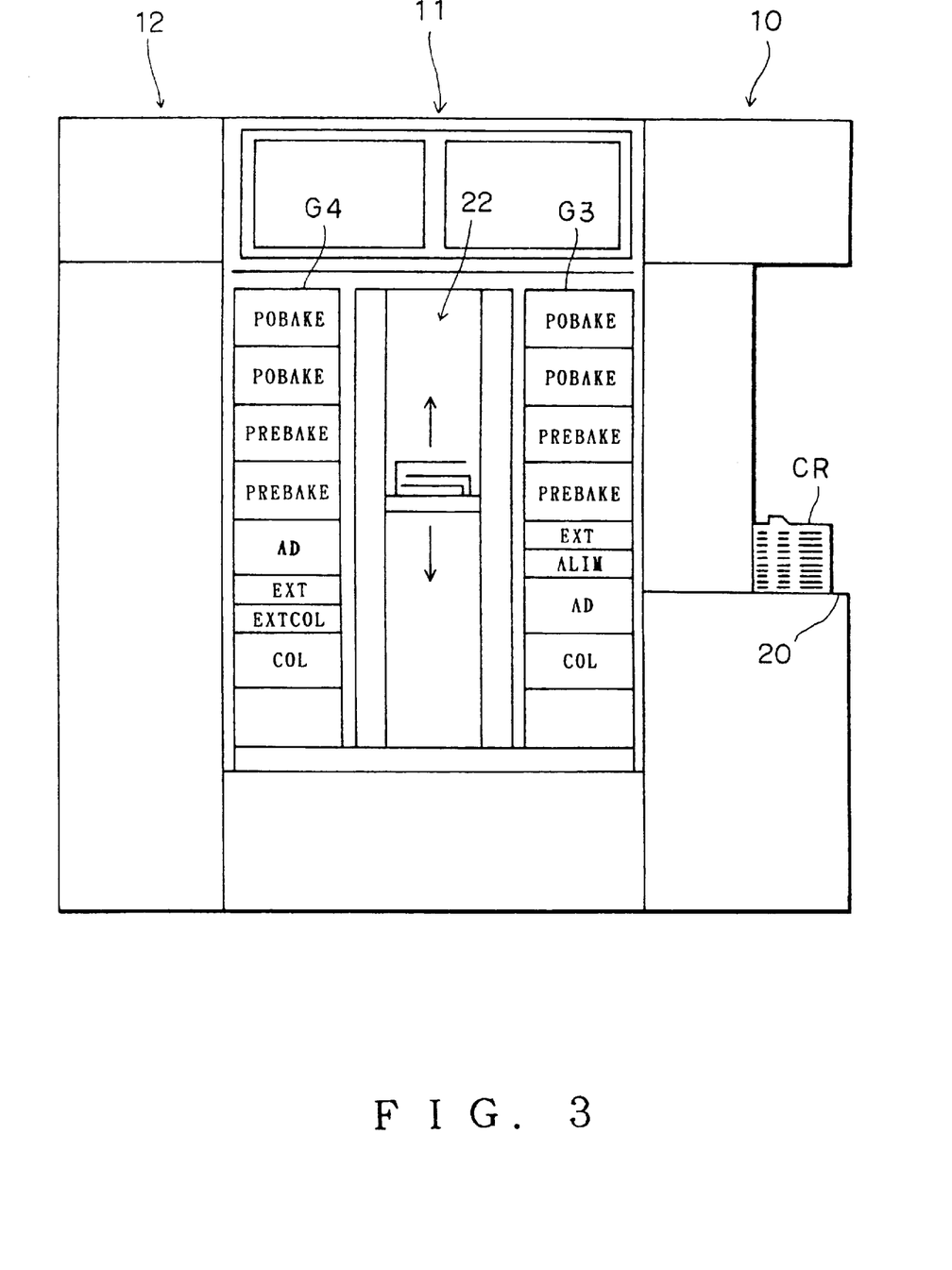
FIG. 3 is a rear view of the resist coating and developing system shown in FIG. 1.

As shown in FIG. 3, in the third processing unit group G3, some eight oven-type processing units, in which the wafer W is mounted on a mounting table (not shown) to perform predetermined processes, are tiered. These processing units are, for example, from the bottom up, a cooling unit (COL) for cooling the wafer, a hydrophobic processing unit (AD) for performing a so-called hydrophobic process to improve the fixity of the resist, an alignment unit (ALIM) for positioning, an extension unit (EXT), heating units (PREBAKE) to pre-bake and heat the wafer before the exposing process, and other heating units (POBAKE) to perform the post-baking.

Similarly, the fourth processing unit group G4 is composed of some eight-tiered oven-type processing units, in which the wafer W is mounted on a mounting table to perform predetermined processes. These processing units are, for example, from the bottom up, a cooling unit (COL) for cooling the wafer, an extension and cooling unit (EXTCOL) which also cools the wafer, an extension unit (EXT), a hydrophobic processing unit (AD), heating units (PREBAKE) for pre-baking, and other heating units (POBAKE) for post-baking.

As shown in FIG. 1, the interface section 12 has the same size as the above processing station 11 in the depth direction (X direction). However, it is smaller in the width direction. As shown in FIGS. 1 and 2, on the front side of this interface section 12, there are disposed a movable pick-up cassette CR and a fixed buffer cassette BR in two stages. On the back side is disposed a peripheral exposing unit 24.

A wafer transfer unit 25 is disposed in the center portion of the interface section 12. The wafer transfer unit 25 moves in directions X and Z (vertically) and makes access to both cassettes CR and BR, and to the peripheral exposing unit 24. The wafer transfer unit 25 rotates freely in the θ direction. Therefore, it is accessible to the extension unit (EXT) in the fourth processing unit group G4 on the process station 11 side, or to the wafer delivery table (not shown) on the adjacent exposing unit side.

Figure 4:
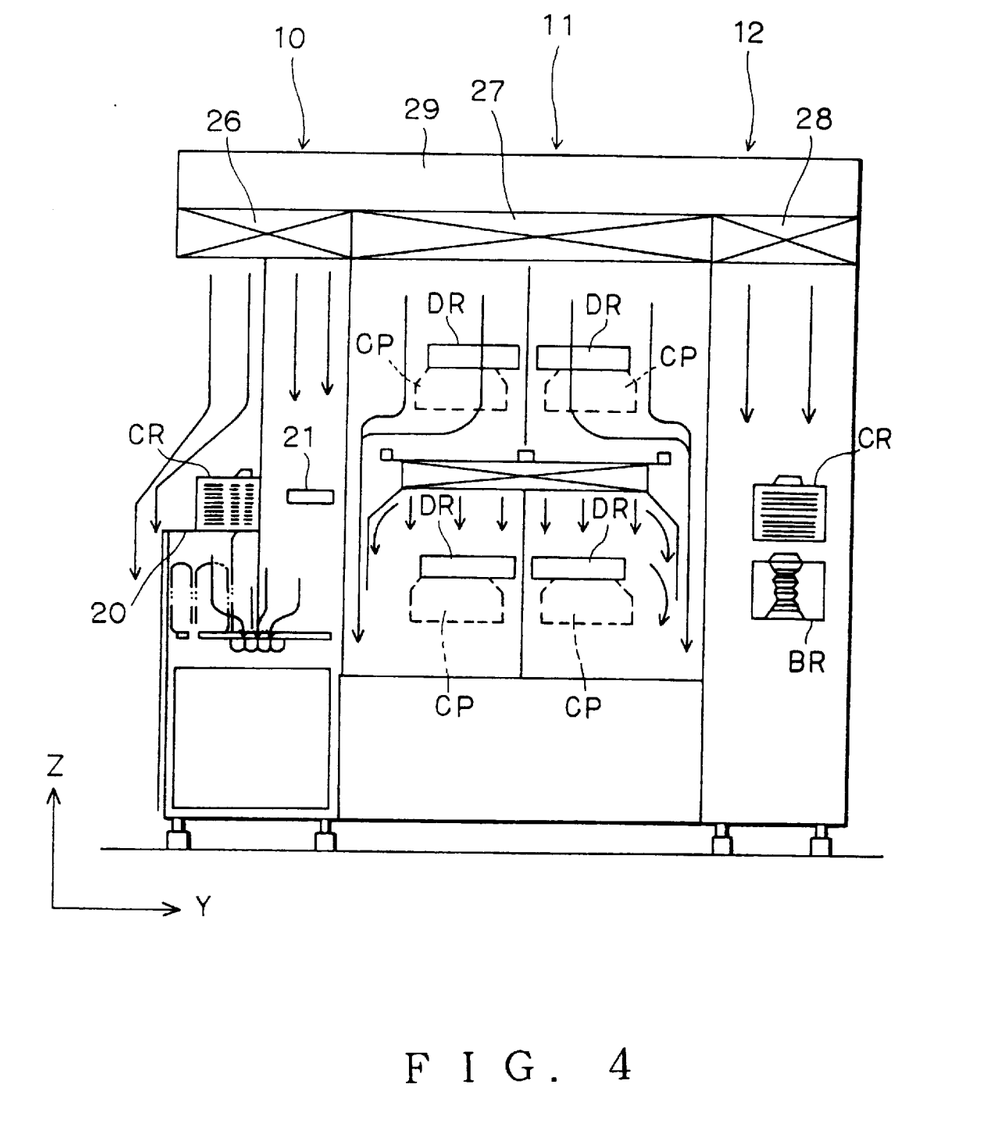
FIG. 4 is a front view showing the air-flow inside the resist coating and developing system shown in FIG. 1.

As shown in FIG. 4, filters 26, 27, and 28 are installed on the upper side of the cassette station 10, the processing station 11, and the interface section 12, respectively. These filters have an upper space 29 in common. The upper space 29 communicates with a lower side air-conditioner (not shown) through a duct (not shown). Therefore, a clean air without ammonia, and controlled in humidity and temperature, is supplied to the upper space 29 from the air-conditioner. The clean air is blown downwards from the upper space 29 through each filter, forming a down-flow of clean air in each section 10, 11, and 12.

Figure 5:
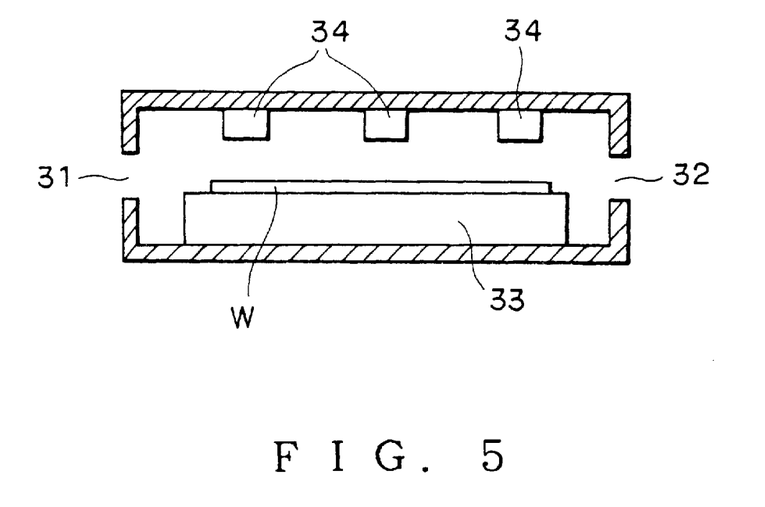
FIG. 5 is a front view showing schematic composition of the alignment unit shown in FIG. 3.

As shown in FIG. 5, openings 31 and 32 are arranged on either side of the alignment unit (ALIM) in the above-mentioned third processing unit group G3. The opening 31 makes access to the wafer transfer unit 21 in the cassette station 10. The opening 32 makes access to the transfer unit 22 in the processing station 11. A wafer mounting table 33 for positioning the wafer W is disposed approximately in the middle of the alignment unit (ALIM). A plurality of reflectivity measuring units 34, for measuring the light reflectivity of the wafer W, is arranged on the upper side of the wafer mounting table 33. Each reflectivity measuring unit 34 measures the reflectivity of light, for example, in the range corresponding to one chip in the wafer W. Each measuring unit 34 beams light to this range, for example, measures the quantity of reflected light, and calculates the reflectivity based on the ratio between the quantity of the beamed light and the reflected light. Such measuring unit may be disposed singularly or in plural. The reflectivity measuring unit may be arranged anywhere along the wafer W transfer path in the resist coating and developing system 1. Or, it may even be arranged separately outside the system 1.

Figure 6:
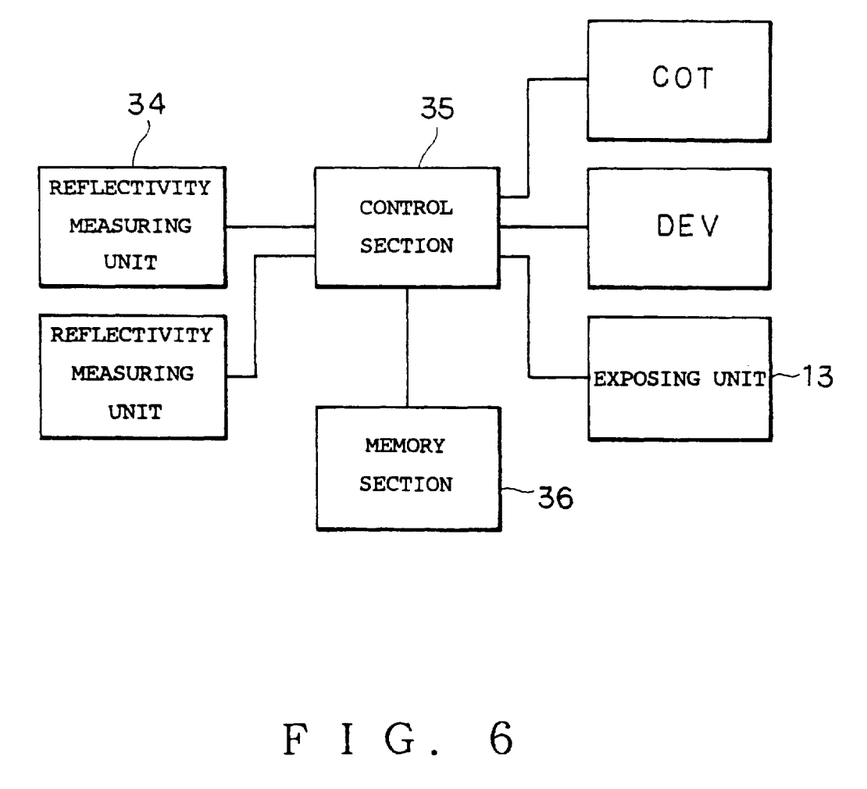
FIG. 6 is a block diagram showing the composition of the control system in the resist coating and developing system shown in FIG.1.

FIG. 6 is a block diagram showing the composition of the control system in the resist coating and developing system, composed in the above way.

Figure 7:
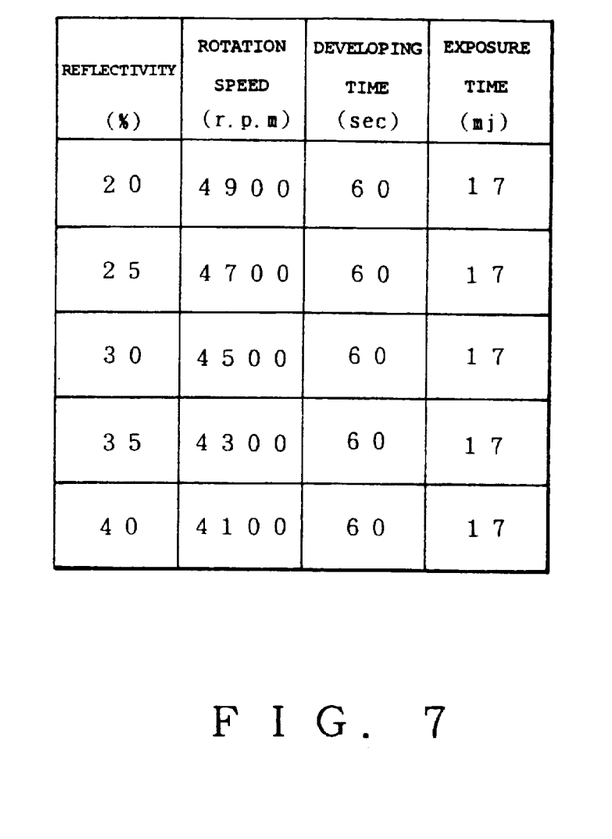
FIG. 7 is a diagram showing the contents of the library in the memory section shown in FIG. 6.

As shown in FIG. 6, the data of the reflectivity measured by each reflectivity measuring unit 34, is sent to a control section 35. A memory section 36 is connected to the control section 35. The memory section 36 memorizes such library as shown in FIG. 7. This library shows the relation between the light reflectivity and the various conditions needed to obtain the resist pattern with the desired line width with respect to the light reflectivity. One of the various conditions is, for example, the rotation speed inside the resist coating unit (COT), when supplying the resist solution while rotating the wafer W. Another condition the exposure time when exposing the wafer W inside the exposing unit 13. Still another condition is the developing time when developing the wafer W inside the developing unit (DEV). The control section 35 acquires the various conditions according to the measured reflectivity from the library shown in FIG. 7. And it controls the above rotation speed, exposure time, and developing time according to the given conditions. The object to be controlled may be either one, two, or all three of the above rotation speed, exposure time, and developing time. It may even be another parameter concerning the line width, other than these conditions.

Next, the process of the resist coating and developing system composed in the above manner, will be described.

Figure 8:
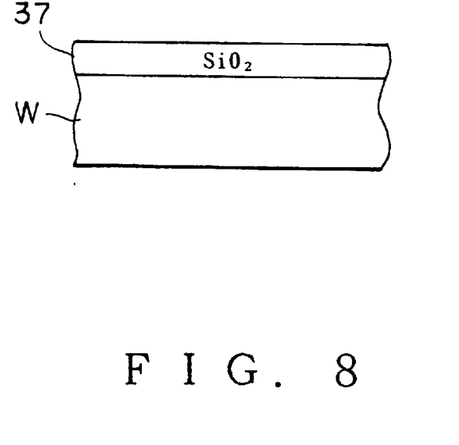
FIG. 8 is a diagram for explaining the difference of the light reflectivity of the undercoat.
Figure 9:
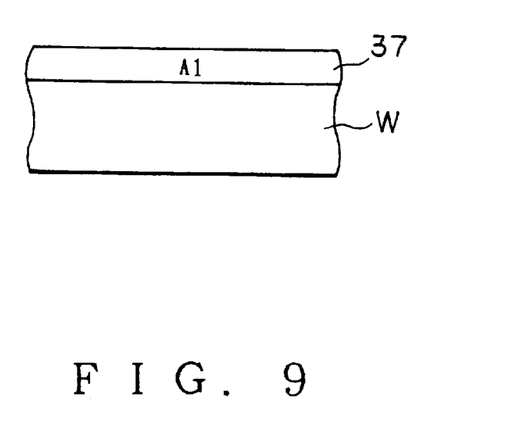
FIG. 9 is a diagram for explaining the difference of the light reflectivity of the undercoat.

In the coating and developing system 1, an unprocessed wafer (an undercoat already formed) is taken out from the cassette C where it is stored, by the wafer transfer unit 21 inside the cassette station 10. It is then transferred into the alignment unit (ALIM) in the third processing group G3 of the processing station 11, and positioned. After that, the light reflectivity of the wafer W is measured by the reflectivity measuring unit 34 inside the alignment unit (ALIM). Now, the wafer W has one region as shown in FIG. 8 with SiO2 as an undercoat 37, and another region as shown in FIG. 9 with Al as an undercoat. The area ratio of SiO2 and Al changes according to the circuit pattern to be formed. And when the light reflectivity of the undercoat 37 changes with the area ratio, the reflectivity measuring unit 34 measures such reflectivity of such process beforehand, and sends the data of the measured reflectivity to the control section 35. Thereafter, the transfer unit 22 extracts the wafer W from the rear side of the alignment unit (ALIM), and transfers it on to the next process.

Next, the wafer W is given a hydrophobic process by the hydrophobic processing unit (AD) of the third processing group G3. It is cooled by the cooling unit (COL) of the third processing group G3 or the fourth processing group G4. It is then coated with a photo-resist film or a photosensitive film by the resist coating unit (COT) of the first processing group G1 or the second processing group G2. During these processes, the control section reads conditions corresponding to the data of the reflectivity measured by the reflectivity measuring unit 34, from the library. With these conditions, it controls the rotation speed when supplying the resist solution while rotating the wafer W in the resist coating unit (COT).

After forming the photosensitive film, the wafer W is heated by the pre-baking unit (PREBAKE) of the third processing group G3 or the fourth processing group G4, so as to evaporate and remove the remaining solution from the photosensitive film on the wafer W. Next, the wafer W is cooled by the extension and cooling unit (EXTCOL) of the fourth processing group G4. It is then mounted inside the extension unit (EXT) of the fourth processing group G4. The wafer transfer unit 25 takes out the wafer W from the rear side. The wafer W is transferred into the exposing unit 13, to be exposed. During these processes, the control section 35 reads the conditions corresponding to the data of the reflectivity measured by the reflectivity measuring unit 34, from the library. It controls the exposing time inside the exposing unit 13, according to the condition.

After exposure, the wafer W is transferred again into the extension unit (EXT) of the fourth processing group G4, and through it, it is handed over to the transfer unit 22. Next, the wafer W is transferred into the developing unit (DEV) of the first processing group G1 or the second processing group G2. It is developed with a developing solution. The developing solution is washed away with a rinsing solution. Thus, the developing process is finished. During these processes, the control section 35 reads the conditions corresponding to the data of the reflectivity measured by the reflectivity measuring unit 34, from the library. It controls the developing time in the developing unit (DEV), under the condition.

Next, the transfer unit 22 takes out the wafer W from the developing unit (DEV). The wafer W is then heated by the post-baking unit (POBAKE) in the third processing group G3 or the fourth processing group G4. It is cooled by the cooling unit (COL) of the third processing group G3 or the fourth processing group G4. It is mounted inside the extension unit (EXT) of the third processing group G3. And then, the wafer transfer unit 21 takes out the wafer W from the rear side, and transfers it into the cassette C for storing the processed wafers, arranged inside the cassette station 10.

According to an embodiment of the invention, the light reflectivity of the wafer W's undercoat is detected by the reflectivity measuring unit 34, before forming a resist pattern. Based upon the detected reflectivity, various conditions are controlled to achieve a highly fine line width of the resist pattern. The conditions to be controlled are the rotation speed when supplying the resist solution while rotating the wafer W inside the resist coating unit (COT), the exposure time inside the exposing unit 13, or the developing time inside the developing unit (DEV).

Next, another embodiment of the invention will be explained.

When manufacturing a semiconductor device from a wafer, for example, undercoat made of oxide film, nitride film and others are formed successively on top of a wafer made of silicon. A resist is coated upon the undercoat. This wafer is exposed by an exposing unit such as a stepper, using a mask (reticle) with a predetermined pattern formed upon it. The wafer is then developed, forming a predetermined resist pattern on the undercoat.

During these steps, in order to keep the line width of the resist pattern within predetermined limits, the exposure level (exposure energy) must be kept at a certain level when exposing. In other words, when the exposure level is either excessive or insufficient when exposing, the line width of the resist pattern becomes wider or thinner than is required.

However, the adequate exposure level is influenced not only by the light directly flashed upon the resist but also by the reflected light from the undercoat and the interference of these lights inside the resist. Therefore, the adequate exposure level delicately changes according to various factors, such as the thickness and kinds of the resist or the undercoat, or the wave length of the exposure light.

The adequate exposure level may therefore change greatly, with even a slight change in the film thickness of the resist or the undercoat. Thus, even if every parameter in every film formation step is fixed, since it is impossible to make the thickness of the undercoat in every batch to be completely the same and to make the difference in the film thickness completely zero, it is quite difficult to always keep the adequate exposure level.

Therefore, when the exposing and developing processes are performed with each processing parameter fixed, the line width of the resist may fall outside the predetermined standards. Conventionally, the line width of the wafer's resist was actually measured with an SEM after the exposing and developing processes, and the measured value was evaluated to see whether it satisfies the predetermined standards.

As for the level of exposing the resist, the energy capable of exposing the resist 100% is generally indicated as E0. In other words, E0 is the smallest energy needed to expose the resist 100%. In the actual exposing process, energy a little more than this E0 is flashed upon the resist, to prevent insufficient exposure.

Figure 10:
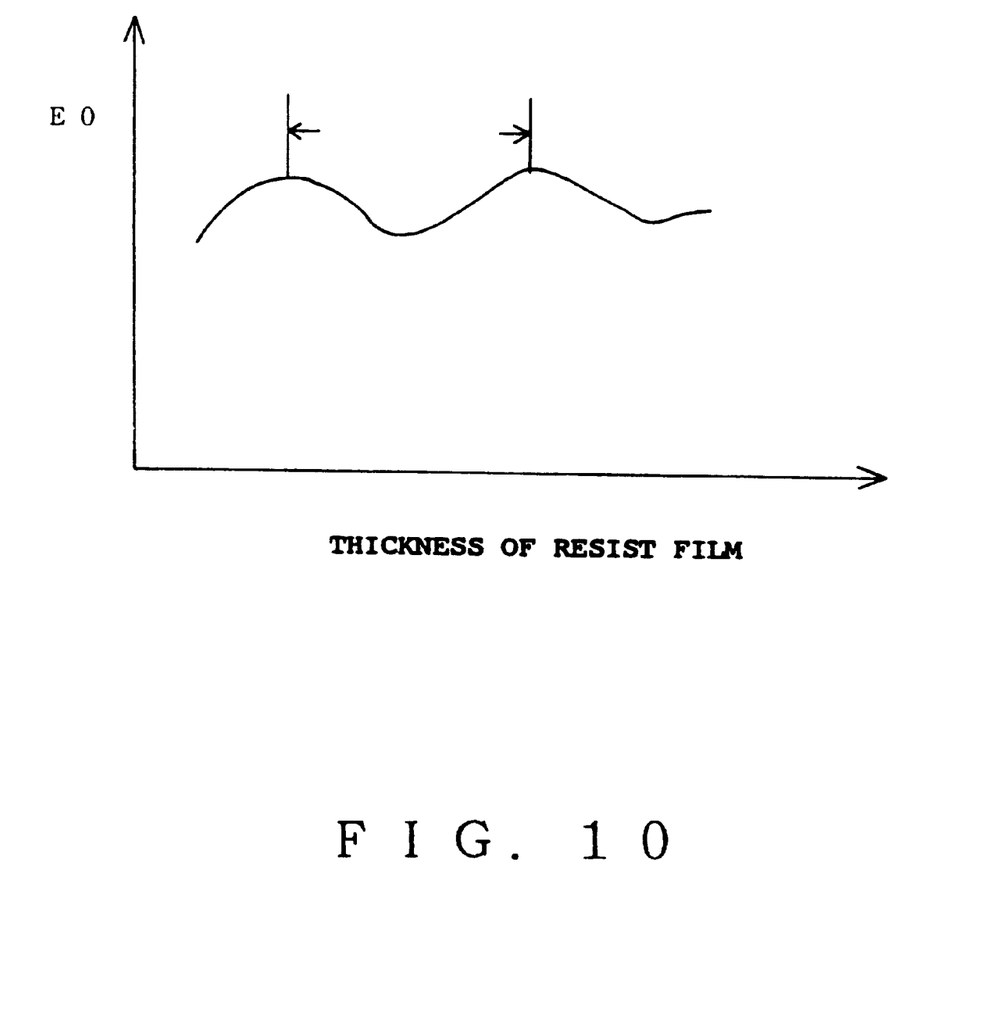
FIG. 10 is a graph showing the relation between the thickness of the resist film and E0.

Now, FIG. 10 is a schematic diagram showing the relation between E0 and the resist thickness, with E0 as the vertical axis and the resist thickness as the horizontal axis. E0 changes with the cycle of $\lambda/4n$ ($\lambda$: the wave length of the exposure light, n: the refractive index of the resist).

When the exposure level is fixed and the developing process following exposure is performed under the same conditions, there lies a certain correlation between the value of E0 and the line width of the resist. Therefore, the line width of the resist formed after development can be predicted by measuring the value of E0.

E0 of each wafer is actually determined during the undercoat formation process and the resist coating process. When the following exposing and developing processes are performed under a fixed condition, the line width after development actually depends upon the E0 value. Therefore, by measuring E0, it is possible to estimate the line width of the resist formed after development. In other words, when the wafer is processed with a fixed exposure level a little larger than the value of E0, and when the value of E0 is within the predetermined limits, there will be no excess or shortage in the actual exposure level, and it is possible to keep the line width of the formed resist within the predetermined required standards.

Figure 11:
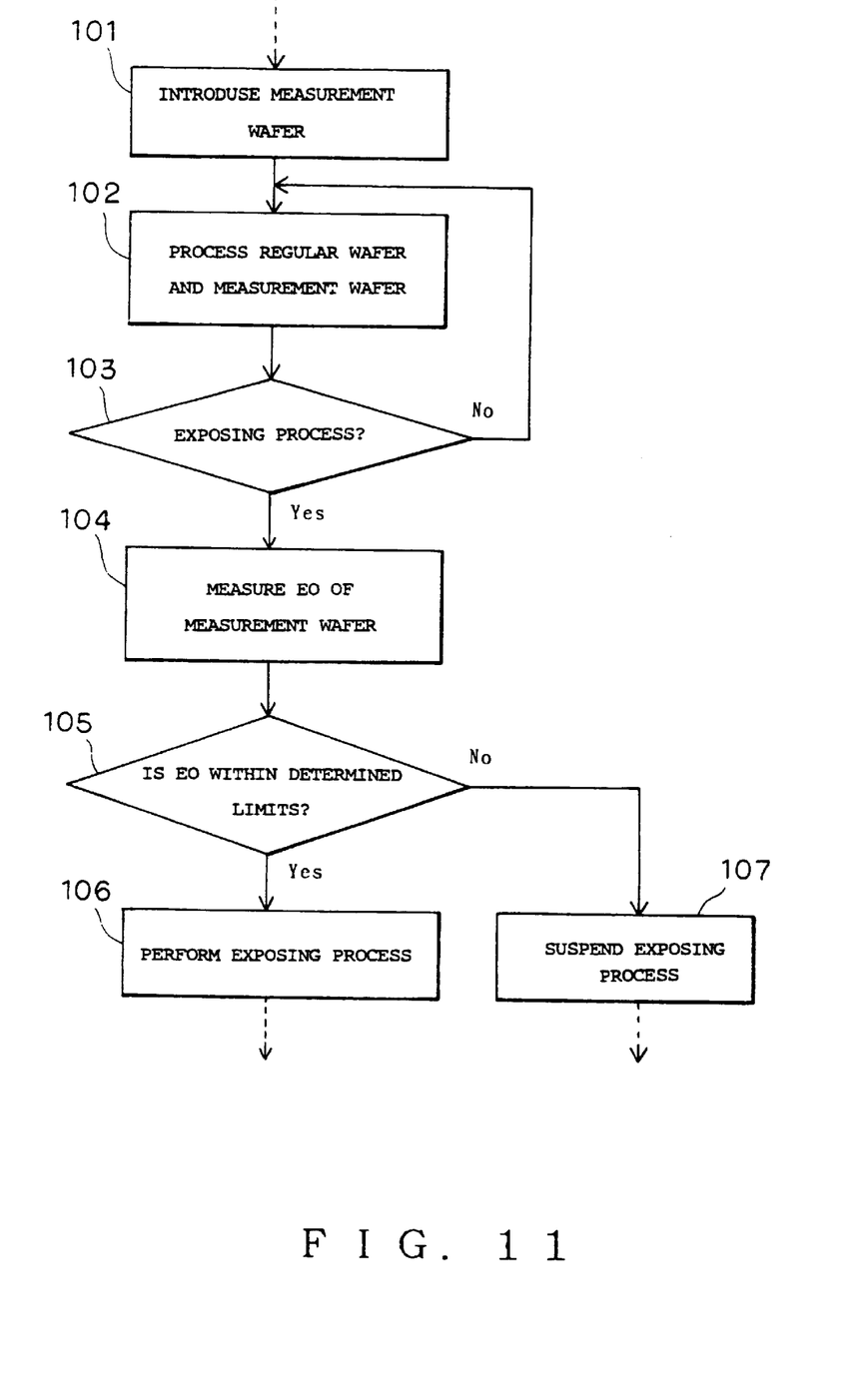
FIG. 11 is a flow chart concerning another embodiment of the invention.

So, in this embodiment, as shown by the flow chart in FIG. 11, the measurement wafer (substrate used for measurement) is introduced (101), for example, one to each batch, from at least the undercoat formation step which influences E0. The measurement wafer is given the film formation and resist coating process just the same as a regular wafer, by various undercoat formation step and resist coating step (102).

When manufacturing semiconductor devices, each wafer receives the exposing and developing processes several times. As for the timing to introduce the measurement wafer, there are two choices. A plurality of measurement wafers may be introduced from the first step, and one or more measurement wafers may be measured after each exposing and developing step. Or the measurement wafer may be introduced from the undercoat formation step, which influences the E0.

And, coming to the wafer exposing step (103), the E0 of the measurement wafer is measured (104) before exposing and developing the regular wafers.

The value of E0 is judged whether to be within the predetermined standards (105). When it is within the standard, the resist line width of other regular wafers inside the same batch is considered to fall within a certain permissible error range, after the following exposing and developing steps. Therefore, regular wafers receive ordinary exposure and developing steps (106).

On the other hand, when the value of E0 is outside the predetermined range, the required resist line width will probably not be obtained when the exposing and developing steps are carried out under the same conditions. Therefore, the exposing and developing steps upon regular wafers are suspended (107).

By changing the processing parameter, for example, by adjusting the exposure level according to the E0 value or adjusting the developing time or temperature, it is possible to obtain the required resist line width.

Such adjustment of the parameters may be performed by workers' hands. Or, as another embodiment, it may be performed by a computer programmed to adjust the exposure level, the developing time, or the temperature according to the E0 value. For example, when controlling the exposure level of the exposing unit, it can be controlled by a computer pre-programmed to increase the exposure level when the E0 value is large and to decrease the exposure level when the E0 value is small.

Figure 12:
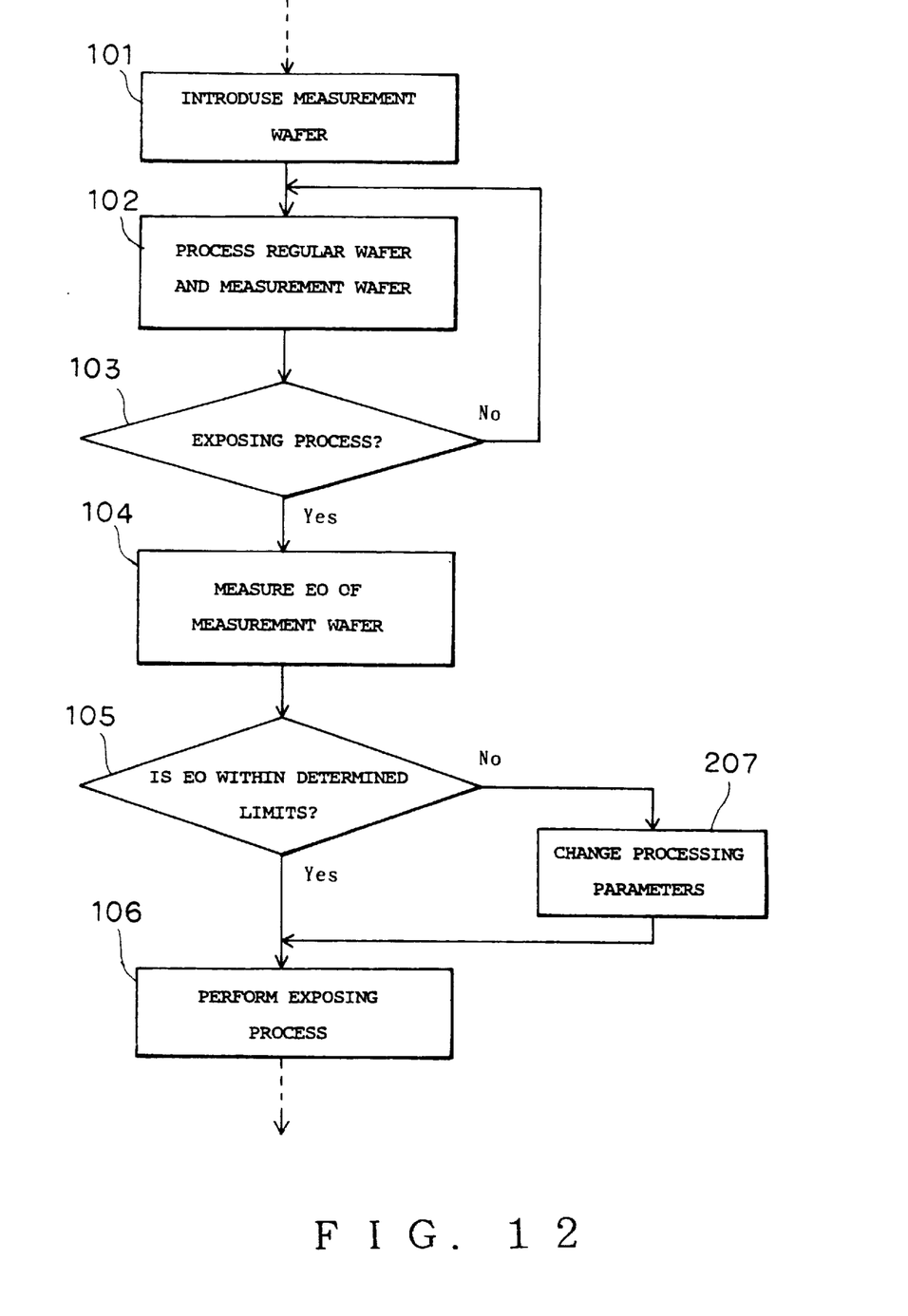
FIG. 12 is a flow chart concerning still another embodiment of the invention.

The flow chart in FIG. 12 shows the process to change the above processing parameters automatically. When the E0 value is outside the required range (105), after changing the processing parameters automatically according to the E0 value (207), the regular wafers will go on to the exposing and developing steps.

Next, an example of a method of measuring the above E0 value will be explained in detail.

In this method, first, for example, different areas of the measurement wafer is exposed by an exposing unit with different exposure levels, gradually increasing the level. The measurement wafer is then developed. Observing whether the resist is completely removed or not, from the area with small exposure level to larger level, the level of exposing the first area with the resist completely removed is recognized as E0. In areas where the exposure level is more than E0, the resist is completely removed. In areas where the exposure level is less than E0, the resist is incompletely removed. The level of exposing the area in between, with the resist removed completely, is recognized as E0.

The judgement whether the resist is completely removed or not may be performed by a worker observing an enlarged view by a TV camera, a microscope, or the like. Or it may be performed by measuring the thickness of the resist film of each area with a film thickness measuring unit, and seeing whether the film thickness is zero.

As can be seen from the above, according to the embodiment, the resist line width formed in the resist processing step can be evaluated without actual measurement of the resist line width using an SEM. Compared to the actual measurement of the resist line width using SEM, the evaluation of the resist line width is performed more easily and quickly, also preventing the contamination of the wafer.

Figure 13:
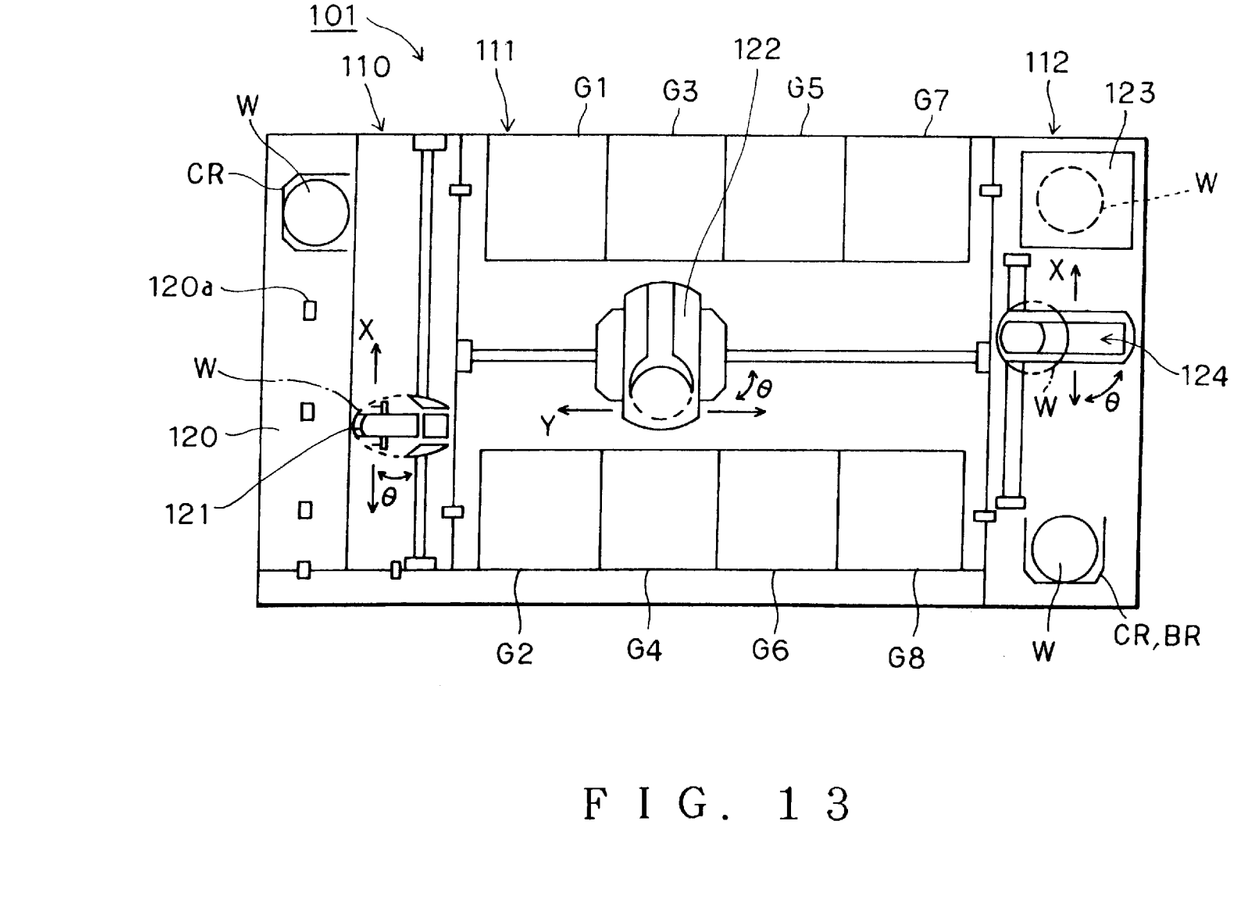
FIG. 13 is a plan view of the whole composition of the resist coating and developing system concerning another embodiment of the invention.
Figure 14:
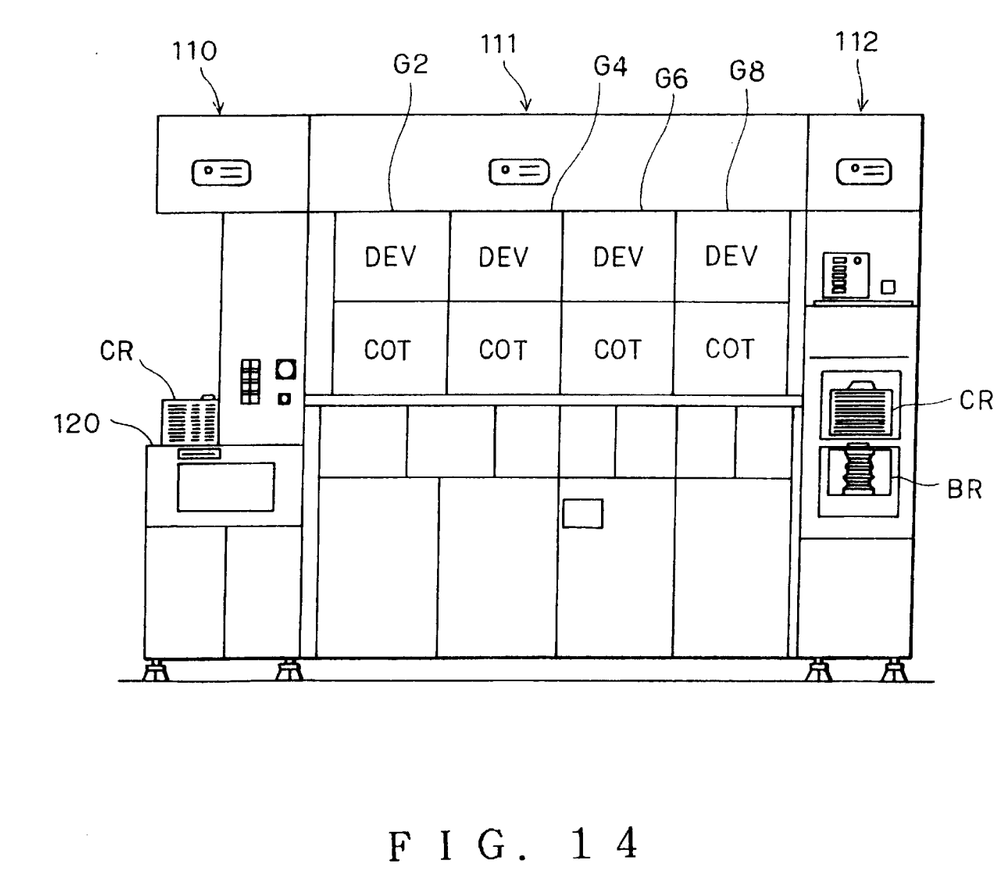
FIG. 14 is a front view of the resist coating and developing system shown in FIG. 13.
Figure 15:
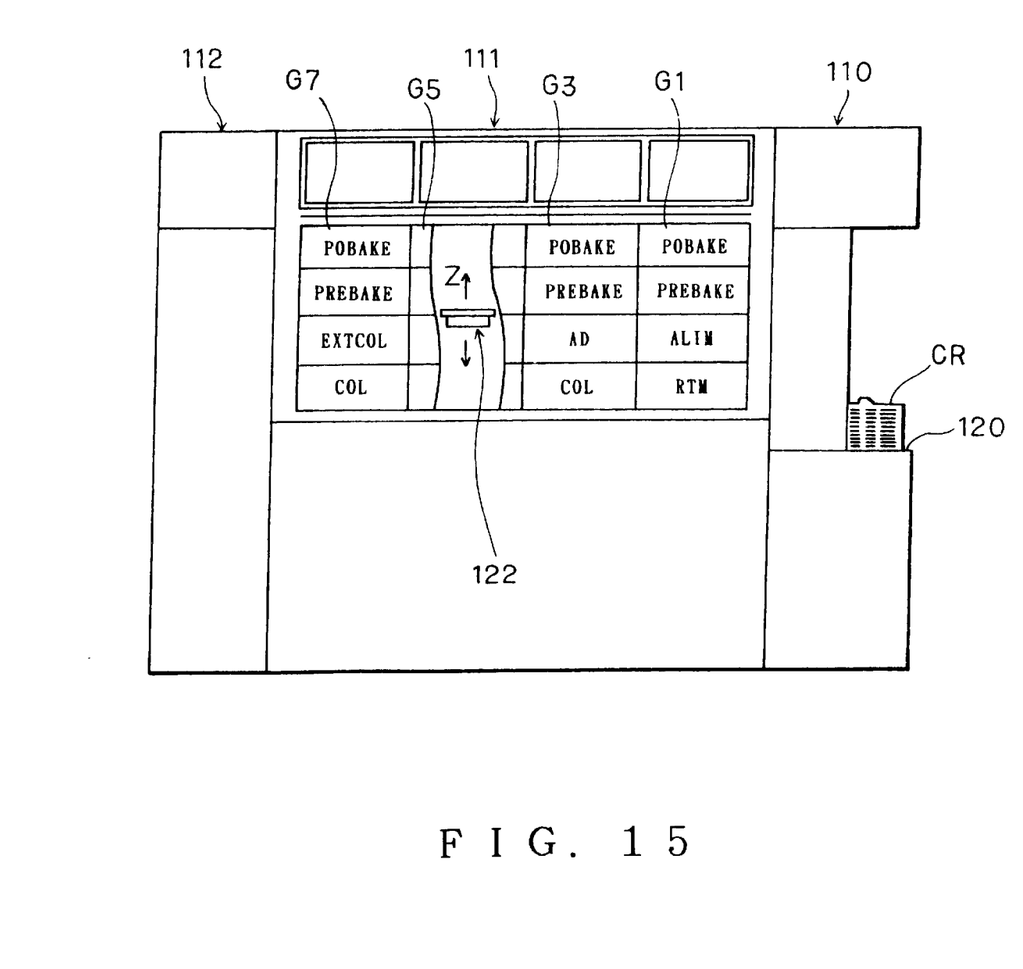
FIG. 15 is a rear view of the resist coating and developing system shown in FIG. 13.

FIGS. 13~15 show the entire structure of the resist coating and developing system 101 concerning another embodiment. FIG. 13 is a plan view, FIG. 14 is a front view and FIG. 15 is a rear view.

As shown in these drawings, the coating and developing system 101 is composed of a cassette station 110, a processing station 111, and an interface section 112, connected integrally. In the cassette station 110, the wafer cassette CR storing a plurality of wafers W is transferred into and out of the cassette station 110. Wafers W are also transferred into and out of the wafer cassette CR. In the processing station 111, various kinds of single wafer processing units are multi-tiered at designated positions. Each processing unit performs a predetermined process to the wafer W one by one. In the interface section 112, the wafer W is sent to an outside exposing unit not shown.

In the cassette station 110, as shown in FIG. 13, a plurality of wafer cassettes CR (four, for example) are arranged in one row in the X direction, each opening for the wafer to come in and out facing the processing station 111. The position of the wafer cassette CR is fixed by a positioning projection 120a on a cassette mounting table 120. A wafer transfer unit 121 transfers the wafer W into and out of the wafer cassette CR. The wafer transfer unit 121 moves in the X direction and the Z direction (the direction in which the wafers W stored inside the cassettes CR are arranged; a vertical direction). The wafer transfer unit 121 also rotates freely in the θ direction, so that it may receive or hand over the wafer W to the wafer transfer unit 122 on the processing station 111 side.

The wafer transfer unit 122 in the processing station 111 moves freely in the Y direction between the cassette station 110 and the interface section 112. It also moves up and down in the Z (vertical) direction, and can rotate in the θ direction.

The various processing units inside the processing station 111 are disposed on either side of the transfer path of the wafer transfer unit 122. Here, a group of processing units multi-tiered in one row will be called one processing unit group. The processing units inside the processing station 111 can be divided into eight processing unit groups $G_1$, $G_2$, $G_3$, $G_4$, $G_5$, $G_6$, $G_7$ and $G_8$. The second processing unit group $G_2$, the fourth group $G_4$, the sixth group $G_6$ and the eighth group $G_8$ are disposed, for instance, on the front side of the system, as shown in FIG. 14. The first processing unit group $G_1$, the third group $G_3$, the fifth group $G_5$ and the seventh group $G_7$, are disposed, for instance, on the rear side of the system, as shown in FIG. 15.

As shown in FIG. 14, the second processing unit group $G_2$, the fourth group $G_4$, the sixth group $G_6$ and the eighth group $G_8$ each include a resist coating unit (COT) and a developing unit (DEV) two-tiered from the bottom in order.

Also, as shown in FIG. 15, the first processing unit group $G_1$, includes the following multi-tiered units. They are, from the bottom up, a resist thickness measuring unit (RTM) for measuring the thickness of the resist film on the wafer's surface, an alignment unit (ALIM) for positioning the wafer W, a pre-baking unit (PREBAKE) for heating the wafer W before the exposing process, and a post-baking unit (POBAKE) for heating the wafer W after the exposing process.

The third processing unit group $G_3$ includes the following multi-tiered units. They are, from the bottom up, a cooling unit (COL) for cooling the wafer W, a hydrophobic processing unit (AD) for performing a hydrophobic process to improve the fixity of the resist coated on the wafer's surface, a pre-baking unit (PREBAKE) for heating the wafer W before the exposing process, and a post-baking unit (POBAKE) for heating the wafer W after the exposing process.

The fifth processing unit group $G_5$, and the seventh group $G_7$ include the following multi-tiered units. They are, from the bottom up, a cooling unit (COL) for cooling the wafer W, an extension/cooling unit (EXTCOL), a pre-baking unit (PREBAKE) for heating the wafer W before the exposing process, and a post-baking unit (POBAKE) for heating the wafer W after the exposing process.

As can be seen from the above, by disposing the units with low processing temperature, such as a cooling unit (COL) and an extension/cooling unit (EXTCOL) on the lower level, and disposing the units with higher processing temperature, such as a pre-baking unit (PREBAKE), a post-baking unit (POBAKE) and a hydrophobic processing unit (AD) on the top, heat interference between the units can be kept at a minimum.

A transferable pick-up cassette CR, a fixed buffer cassette BR, a peripheral exposing unit 123, and a wafer transfer unit 124 are disposed in the interface section 112. The wafer transfer unit 124 delivers and receives the wafer W to and from the cassettes CR and BR, by moving in the X and Z direction. The wafer transfer unit 124 also moves freely in the θ direction, delivering and receiving the wafer W to and from the wafer transfer unit 122 on the processing station 111 side and the wafer delivery table (not shown) on the outside exposing unit side.

The developing unit (DEV) includes inside a spin chuck, a bowl, a developing solution supplying nozzle, and so on. The spin chuck rotates while holding the wafer W in a horizontal position by vacuum. The bowl surrounds the outside and the underside of the spin chuck and has a drain port and an exhaust port at the bottom. The developing solution supplying nozzle sprays the developing solution on the surface of the wafer held on top of the spin chuck.

The resist coating unit (COT) includes inside a spin chuck, a bowl, a resist solution supplying nozzle, and so on. The spin chuck rotates while holding the wafer W in a horizontal position by vacuum. The bowl surrounds the outside and the underside of the spin chuck and has a drain port and an exhaust port at the bottom. The resist solution supplying nozzle sprays the resist solution on the surface of the wafer held on top of the spin chuck.

Next will be described the procedures for processing the wafer W with this coating and developing system.

First, in the cassette station 110, the wafer transfer unit 121 makes access to the cassette CR storing the unprocessed wafer W on top of the cassette mounting table 120, and takes out one wafer W from the cassette CR. Then, the wafer transfer unit 121 hands over the wafer W to the wafer transfer unit 122 in the processing station 111. The wafer transfer unit 122 moves to an alignment unit (ALIM) in the first processing unit group $G_1$, and places the wafer W inside the alignment unit (ALIM). Here, when this were a first wafer in the batch to be processed, the measurement wafer will be selected first for measuring the aforementioned E0.

After the wafer W is orientated flat and centered by the alignment unit (ALIM), the wafer transfer unit 122 receives the aligned wafer W, and transfers it to the hydrophobic processing unit (AD) of the third processing unit group $G_3$ for the hydrophobic process.

After the hydrophobic process, the wafer transfer unit 122 transfers the wafer W to the predetermined pre-baking unit (PREBAKE) for baking, and then to the predetermined cooling unit (COL). Inside the cooling unit (COL), the wafer W is cooled to 23° C., for example, the set temperature before the resist coating process. After cooling, the wafer transfer unit 122 transfers the wafer W to the predetermined resist coating unit (COT), where a resist is coated upon the wafer W's surface inside.

After the resist coating process, the wafer transfer unit 122 takes out the wafer W from the resist coating unit (COT), and transfers it again to the predetermined pre-baking unit (PREBAKE). The wafer W is heated here for a predetermined period of time with a predetermined temperature, say 100° C., to evaporate and remove the remaining solution from the coated film upon the wafer W.

Then, the wafer transfer unit 122 transfers the wafer W to an extension/cooling unit (EXTCOL). Here, the wafer W is cooled to 24° C., for example, a temperature suitable for the next step, that is, peripheral exposure by the peripheral exposing unit 123.

The wafer transfer unit 122 then hands over the wafer W to the wafer transfer unit 124 in the interface section 112. The wafer transfer unit 124 transfers the wafer W to the peripheral exposing unit 123 inside the interface section 112. Here, the wafer W is exposed on its peripheral portion.

After the peripheral exposure, the wafer transfer unit 124 transfers the wafer W from the peripheral exposing unit 123, and moves to the wafer delivery table (not shown) in the adjacent exposing unit side. Here, the wafer W may temporarily be stored inside the buffer cassette BR when necessary, before being handed over to the exposing unit.

Then, the exposing unit exposes the wafer W using a reticle. When the wafer handed over to the exposing unit were the aforementioned measurement wafer, the exposure for measuring E0 will be performed with different exposure levels according to each area, instead of exposure under a uniform exposure level using a reticle. The exposure level for exposing various areas of the measurement wafer starts from a value a little less than the predicted E0 value, and gradually increases to a level a little larger.

The wafer W is sent back to the wafer delivery table on the exposing unit side after receiving exposure on its entire surface by the exposing unit. The wafer transfer unit 124 in the interface section 112 then makes access to the wafer delivery table, receives the wafer W after exposure, and hands it over to the wafer transfer unit 122 in the processing station 111. Here, the wafer W may be temporarily stored in the buffer cassette BR inside the interface section 112 when necessary, before being handed over to the processing station 111.

The wafer transfer unit 122 transfers the received wafer W to the predetermined post-baking unit (POBAKE). In this post-baking unit (POBAKE), the wafer W is baked for a determined period of time on a hot plate (not shown).

The wafer transfer unit 122 then transfers the baked wafer W to either one of the cooling units (COL). The wafer W is cooled to normal temperature inside the cooling unit (COL). Then, the wafer transfer unit 122 transfers the wafer W to the predetermined developing unit (DEV).

Inside the developing unit (DEV), the wafer W is mounted on the spin chuck, and a developing solution is sprayed evenly on the surface of the wafer W's resist with a spray method, for example. After development, a rinsing solution is poured onto the wafer W's surface to wash off the developing solution. Then, the wafer W is dried by high speed rotation.

The wafer transfer unit 122 then transfers the wafer W out of the developing unit (DEV), and into the next predetermined post-baking unit (POBAKE) again. The post-baking unit (POBAKE) heats the wafer W for a determined period of time to, say 100° C. With this heat treatment, the resist swollen up by development hardens and chemical tolerance of the wafer W improves.

After post-baking, the wafer transfer unit 122 transfers the wafer W out of the post-baking unit and into the next predetermined cooling unit (COL) for cooling.

After the wafer W is cooled to normal temperature, when the received wafer W were a regular wafer, the wafer transfer unit 122 transfers the wafer W to the wafer transfer unit 121 on the cassette station 110 side. Then, the wafer transfer unit 121 transfers the received wafer W inside the predetermined wafer storing ditch of the cassette CR for storing the processed wafers, on top of the cassette mounting table 120. On the other hand, when the received wafer W were the measurement wafer, the wafer transfer unit 122 transfers it into a resist thickness measuring unit (RTM).

The resist thickness measuring unit(RTM) measures the thickness of the resist film in each area of the aforementioned measurement wafer, from the area of small exposure level to larger level successively, to find out the exposure area where the thickness of the resist film first becomes zero.

The exposure level (exposure energy) of the area where the thickness of the resist film first becomes zero, is recognized as E0. When the value of this E0 is within the predetermined range, an ordinary process is carried out upon the wafer. But when the above E0 value is out of the predetermined range, the ordinary process upon the wafer is suspended. And after a worker changes the processing parameter, the ordinary wafer processing is presumed.

Here, various processing parameters, such as the exposure time in the exposing unit or the developing time in the developing unit, may be pre-programmed to change suitably according to the value of E0. Thus, the parameters change automatically, and the ordinary wafer processing may be carried out consecutively.

As can be seen from the above, according to this embodiment, the line width of the resist may be evaluated without measurement using the SEM. Also, by composing the system to change the processing parameters automatically according to the value of E0, automatic and highly fine control upon the line width of the resist is possible without any operation by workers. Moreover, when these conditions are applied to the embodiment described first, finer control upon the line width of the resist is possible.

The present invention is not intended to be limited to the above-described embodiments, and various changes may be made without departing from the spirit of the invention. Such changes are also included in the scope of the present invention.

For example, in the above embodiment, the judgement to see whether the resist is completely removed or not was made by measuring the film thickness, but it may also be made by a worker observing an enlarged view by a microscope, a TV camera, or the like.

Needless to say, the substrate is not limited to the above-mentioned wafer W. It may also be an LCD substrate, a glass substrate, a CD substrate, a photo mask, a printed circuit board, a ceramic substrate, and so forth.

The above-described embodiment is strictly intended to bring the technical contents of the present invention into focus. Therefore, the present invention should not be interpreted in a narrow sense by limiting to such a concrete example, but it is applicable in various forms within the range of the spirit of the present invention and the extent described in the claims.

What is claimed is:

1. An apparatus for forming a predetermined resist pattern on a substrate coated with an undercoat, the apparatus comprising:

means for detecting a light reflectivity of the undercoat;

means for coating the resist on the substrate based upon a predetermined rotation speed of the substrate;

means for exposing the substrate coated with the resist based upon a predetermined exposure time;

means for developing the exposed substrate based upon a predetermined developing time;

means for storing a plurality of data of light reflectivity, rotation speed, exposure time and developing time with a predetermined relation therebetween; and means for controlling at least one of the predetermined rotation speed, exposure time and developing time by using at least one of the stored corresponding data based upon the detected reflectivity according to the predetermined relation therebetween.

2. The apparatus as set forth in claim 1, wherein said coating means supplies a resist solution on the substrate while rotating the substrate based upon the predetermined or the controlled rotation speed of the substrate.

3. The apparatus as set forth in claim 1, further comprising:

means for forming a predetermined undercoat on a measurement, substrate for along with said substrate coated with an undercoat;

means for coating the resist on the substrate for measurement;

means for exposing the substrate for measurement, to find out the exposure energy needed and sufficient for the resist to be fully exposed; and means for performing a predetermined process based upon the exposure energy determined.

* * * * *